United States Patent
Lee et al.

(10) Patent No.: US 10,541,131 B2
(45) Date of Patent: Jan. 21, 2020

(54) INDIUM GALLIUM ARSENIDE SURFACE PASSIVATION BY SULFUR VAPOR TREATMENT

(71) Applicant: International Business Machines Corporation, Armonk, NY (US)

(72) Inventors: Yun Seog Lee, White Plains, NY (US); Talia S. Gershon, White Plains, NY (US); Joel P. De Souza, Putnam Valley, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/000,053

(22) Filed: Jun. 5, 2018

(65) Prior Publication Data

US 2019/0043715 A1 Feb. 7, 2019

Related U.S. Application Data

(62) Division of application No. 15/670,300, filed on Aug. 7, 2017.

(51) Int. Cl.
*H01L 21/02* (2006.01)
*H01L 29/20* (2006.01)

(52) U.S. Cl.
CPC ........ *H01L 21/02312* (2013.01); *H01L 29/20* (2013.01); *H01L 21/02546* (2013.01)

(58) Field of Classification Search
CPC ......... H01L 21/02052; H01L 21/02304; H01L 21/02312; H01L 21/02546;
(Continued)

(56) References Cited

U.S. PATENT DOCUMENTS 5,451,542 A 9/1995 Ashby
5,599,748 A 2/1997 Holloway et al.
(Continued)

OTHER PUBLICATIONS

Xuan, Y., et al., "Simplified Surface Preparation for GaAs Passivation Using Atomic Layer-Deposited High-K Dielectrics", IEEE Transaction on Electron Devices, Aug. 2007, vol. 54, No. 8, pp. 1811-1817.
(Continued)

*Primary Examiner* — Joseph M Galvin, III
(74) *Attorney, Agent, or Firm* — Fleit Intellectual Property Law; Jose Gutman

(57) ABSTRACT

A semiconductor structure, a method, and an apparatus for in-situ sulfur vapor passivation of an interface surface of an indium gallium arsenide layer of the semiconductor structure. A method includes elemental sulfur-vapor passivation of an interface surface of an indium gallium arsenide layer disposed on a substrate. A dielectric layer can be deposited on the sulfur-vapor passivated interface surface. An annealing process can be performed after the deposition of the dielectric layer. The annealing process anneals the indium gallium arsenide layer including the sulfur-vapor passivated interface surface and the dielectric layer disposed on the sulfur-vapor passivated interface surface. The sulfur-vapor passivation, the deposition of the dielectric layer, and the anneal, can be performed in-situ in a vacuum chamber without breaking a vacuum of the vacuum chamber following a III-V material growth process in the vacuum chamber to form the indium gallium arsenide layer.

20 Claims, 7 Drawing Sheets

(58) Field of Classification Search
CPC ......... H01L 21/02664; H01L 21/28264; H01L 21/306; H01L 21/67207; H01L 29/20; H01L 29/513
See application file for complete search history.

(56) References Cited

U.S. PATENT DOCUMENTS

| | | |
|---|---|---|
| 6,197,667 B1 | 3/2001 | Chang et al. |
| 6,228,672 B1 | 5/2001 | Ashby |
| 6,380,097 B1* | 4/2002 | Dauplaise ......... H01L 21/02052 257/E21.228 |
| 6,924,218 B2 | 8/2005 | Marsh et al. |
| 9,245,742 B2 | 1/2016 | Haukka et al. |
| 9,558,931 B2 | 1/2017 | Tang et al. |
| 2004/0115908 A1 | 6/2004 | Marsh et al. |
| 2011/0089469 A1* | 4/2011 | Merckling ........ H01L 21/28264 257/201 |
| 2014/0027884 A1* | 1/2014 | Tang .................... H01L 23/293 257/632 |
| 2014/0315331 A1 | 10/2014 | Niyogi et al. |
| 2015/0040972 A1 | 2/2015 | Cornfeld |
| 2015/0118834 A1 | 4/2015 | Loh et al. |
| 2016/0013048 A1 | 1/2016 | Gaylord et al. |

OTHER PUBLICATIONS

List of IBM Patents or Patent Applications Treated as Related.

* cited by examiner

INDIUM GALLIUM ARSENIDE SURFACE PASSIVATION BY SULFUR VAPOR TREATMENT

BACKGROUND OF THE INVENTION

The present invention generally relates to the field of semiconductor devices, and more particularly relates to passivation of surfaces of semiconductor devices.

In modern semiconductor electronics technology, $In_xGa_{(1-x)}As$ where $0<x<1$ (indium gallium arsenide, InGaAs) is a III-V compound semiconductor material that can be used in semiconductor structures and devices for high performance (e.g., very high speed, low noise, and very low power consumption) applications such as in electronics, wireless communications, and optoelectronics. For example, high-electron-mobility-transistor (HEMT) devices using InGaAs channels are one of the fastest types of transistors. Electron mobility and hole mobility are key parameters for design and performance of electronic devices. InGaAs devices at the interface surface of the InGaAs layer material can have very high value of electron mobility and a very large ratio of electron to hole mobility. The mobility is proportional to the carrier conductivity. As mobility increases, so does the current-carrying capacity of transistors. A higher mobility shortens the response time of the semiconductor devices and reduces series resistance, and accordingly improves semiconductor device efficiency and reduces noise and power consumption.

However, InGaAs material has some limitations in terms of a high density of surface defects at an interface surface of an InGaAs layer that typically limits the device performance. For example, when a dielectric material having a dielectric constant that is greater than silicon dioxide (k greater than 4.0) is deposited on a InGaAs semiconductor material that has an unpassivated surface, the interface between the high-k dielectric and the InGaAs semiconductor material is typically poor, resulting in a high interface defect density (on the order of about $10^{13}$ $cm^{-2}$ $eV^{-1}$ or greater). Surface passivation of an interface surface of indium gallium arsenide (InGaAs) layer material is a critical process to fabricate high performance microelectronic devices. Passivation of an interface surface of indium gallium arsenide (InGaAs) layer material typically involves creation of a layer of material that is applied as a microcoating typically created by chemical reaction with the base InGaAs material at the interface surface.

Sulfurization of the InGaAs material surface is a promising passivation option in terms of passivation of the interface surface of the InGaAs layer material to reduce the surface defect density. A conventional process for passivation of an interface surface of indium gallium arsenide (InGaAs) layer material involves applying ammonium sulfide $((NH_4)_2S)$ chemical solution in a wet chemical based treatment. This wet chemical treatment process has undesirable attributes for a semiconductor fabrication process, including: 1) the wet treatment decomposes at room temperature, 2) it releases very offensive smell, 3) the chemicals used are very toxic, and 4) a reaction temperature of the applied ammonium sulfide $((NH_4)_2S)$ chemical solution normally cannot exceed approximately 100 degrees Celsius (boiling temperature).

SUMMARY OF THE INVENTION

In one embodiment, a method for fabricating a semiconductor structure is provided. The method comprises, in a high vacuum environment below $10^{-3}$ Torr, performing thermally-cracked sulfur-vapor passivation of an interface surface of an indium gallium arsenide layer disposed on a substrate of a semiconductor structure. The method then performs deposition of a high-k dielectric layer on the sulfur-vapor passivated interface surface of the indium gallium arsenide layer disposed on the substrate. An anneal is performed, after the deposition, on the semiconductor structure including the sulfur-vapor passivated interface surface thereof, and the dielectric layer disposed on the sulfur-vapor passivated interface surface. According to an embodiment, the anneal is performed in a hydrogen gas containing ambient at a temperature of greater than 300° C. to obtain an interface defect density ($D_{it}$) distribution at the sulfur-vapor passivated interface surface of the indium gallium arsenide layer of less than less than $2 \times 10^{11}$ $eV^{-1}$ $cm^{-2}$ values measured near mid gap across the band-gap.

In another embodiment, a semiconductor structure is provided. The semiconductor structure comprises a substrate and one or more III-V layers disposed on the substrate, with a surface layer of indium gallium arsenide having an interface surface. A sulfur film layer is disposed directly on, and passivating, the interface surface of the surface layer of indium gallium arsenide, the sulfur passivated interface surface of the surface layer of indium gallium arsenide having an interface defect density ($D_{it}$) distribution of less than $2 \times 10^{11}$ $eV^{-1}$ $cm^{-2}$ measured near mid gap across the band-gap.

In yet another embodiment, an apparatus for in-situ sulfur-vapor passivation of an interface surface of an indium gallium arsenide layer of a semiconductor structure is provided. The apparatus comprises at least one vacuum chamber having a main chamber compartment for sulfur-vapor passivation of an interface surface of an indium gallium arsenide layer disposed on a substrate located in a work area in the main compartment. A sulfur source heating chamber compartment is for heating a solid material comprising sulfur to a temperature of at least 150° C. to generate a thermally-cracked (activated) pure sulfur vapor flux (also referred to as sulfur vapor) in the sulfur source heating chamber compartment. A sulfur vapor thermally cracking zone channel is mechanically coupled at one end to the sulfur source heating chamber compartment and the other end of the sulfur vapor thermally cracking zone channel extending away from the sulfur source heating chamber compartment. The sulfur vapor thermally cracking zone channel providing a sulfur vapor flux coupling channel for transferring the sulfur vapor flux generated in the sulfur source heating chamber compartment to the work area in the main chamber compartment. The vapor heating cracking zone channel for further heating to a temperature of at least 700° C. the thermally-cracked (activated) pure sulfur vapor flux transferred from the sulfur source heating chamber compartment through the vapor heating cracking zone channel. The vapor heating cracking zone channel generates a thermally-cracked (activated) pure sulfur vapor flux that is highly reactive, even more than the sulfur vapor flux generated in the sulfur source heating chamber compartment. A substrate holder is located in the work area in the main chamber compartment of the at least one vacuum chamber. The substrate holder is for holding in the work area at least one substrate with an exposed interface surface of an indium gallium arsenide layer disposed on each of the at least one substrate. An output of the other end of the vapor heating cracking zone channel being aimed toward the substrate holder in the work area in the main chamber compartment to uniformly distribute the highly reactive thermally-cracked pure sulfur vapor flux from the output directly onto the exposed interface surface of the indium gallium arsenide layer disposed on each of the at least one substrate held by the substrate holder in the work area in the main chamber compartment.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
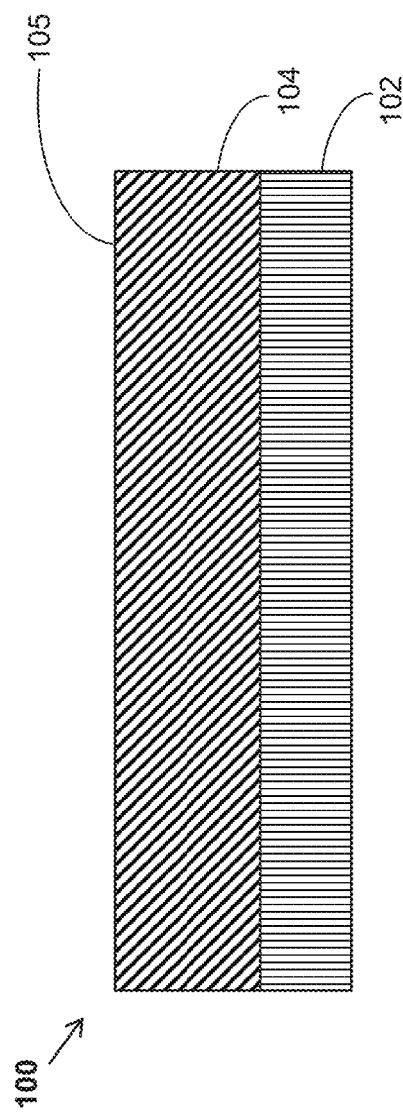
FIGS. 1 to 4 illustrate cross-sectional side views of an example semiconductor structure at various process steps in a semiconductor structure fabrication process, according to an embodiment of the present invention.

Surface passivation of indium gallium arsenide material is a critical process to fabricate high performance microelectronic devices. These are high speed and low power semiconductor devices based on III-V compound semiconductor material such as InGaAs. Surface defects result in device instability, Fermi-level pinning, and large subthreshold swing. Surface defects also affect electron and hole mobility, such as by causing scattering of the charge carriers at the interface surface which can degrade performance of the device. Surface passivation of the InGaAs layer can yield a smoother surface with significantly reduced amount of surface defects at an interface surface of the InGaAs layer material in a semiconductor device, which results in a higher performance capability of the semiconductor device.

Sulfur-based passivation of the interface surface of the InGaAs layer material provides a stable and effective process for fabrication of semiconductor devices. A surface sulfurization reaction typically occurs more effectively with a higher temperature (e.g., 150 degrees to 400 degrees Celsius) applied to a solid sulfur source in a vacuum chamber also containing the interface surface of the InGaAs layer material to be passivated. The vacuum chamber can generate and maintain a high vacuum environment below $10^{-3}$ Torr in the vacuum chamber. A heated sulfur vapor, including reactive sulfur particles, is created in the vacuum chamber and deposited on the interface surface of the InGaAs layer material thereby passivating the surface. Optionally, the sulfur vapor can be heated to a much higher temperature (e.g., 200 degrees to 800 degrees Celsius), as will be discussed more fully below, causing cracking of the sulfur vapor particles into more reactive sulfur vapor particles (e.g., $S_8$ is cracked into S, $S_2$, $S_3$, $S_4$, etc.) that after being deposited on the interface surface more effectively react with and passivate the interface surface of the InGaAs layer material.

High temperature, however, is not the only way to create a surface sulfurization reaction. For example, in a vacuum chamber a plasma field can be applied to a sulfur source (e.g., sulfur solid, liquid sulfur, or heated sulfur vapor) to cause cracking of sulfur vapor to produce more reactive sulfur vapor including various types of reactive sulfur particles (e.g., $S_8$ is cracked into S, $S_2$, $S_3$, $S_4$, etc.). The plasma can be used in the vacuum chamber in addition to the heating of the solid sulfur source as discussed above, or it can be used instead of the heating of the solid sulfur source. The combination of using the plasma with the heating of the solid sulfur source creates much more reactive sulfur vapor in the vacuum chamber. The much more reactive sulfur vapor particles deposited on an interface surface of an indium gallium arsenide (InGaAs) layer material in the vacuum chamber effectively react with and passivate the interface surface. While, and/or after, depositing the reactive sulfur particles on the interface surface, the indium gallium arsenide (InGaAs) layer material in the vacuum chamber can be heated (e.g., up to approximately 400 degrees Celsius) to further promote the sulfurization reaction of the interface surface of the InGaAs layer material.

As will be discussed below, one or more embodiments of the present invention overcome the problems identified above by elemental sulfur-vapor passivating the interface surface of the InGaAs semiconductor material in a sulfur-vapor passivation process. Such sulfur-vapor passivation process, according to various embodiments, is performed in-situ, without breaking a vacuum, integrated into an in-situ semiconductor fabrication process. The sulfur-vapor passivation process significantly reduces a defect density of the interface surface of InGaAs semiconductor material and improves semiconductor structure and semiconductor device performance parameters. The inventors have demonstrated an elemental sulfur-vapor passivation process that obtained an interface defect density ($D_{it}$) distribution at the sulfur-vapor passivated interface surface of the indium gallium arsenide layer to a record low level of less than $2 \times 10^{11}$ $eV^{-1}$ $cm^{-2}$ measured near mid gap across the band-gap. Specifically, the inventors characterized the $D_{it}$ values by CV (capacitance vs. voltage) and G-p (conductance vs. frequency) measurements at 300 K with a various frequency to map the $D_{it}$ defect density distribution and the lowest $D_{it}$ values measured near mid gap across a band-gap.

Moreover, this surface passivation process can be integrated with a semiconductor fabrication process that in-situ both grows the III-V material (i.e., the InGaAs semiconductor material layer) in a vacuum chamber and, without breaking vacuum, passivates the interface surface of the indium gallium arsenide layer. This in-situ semiconductor fabrication and passivation process significantly reduces the number of process steps required to fabricate semiconductor devices while obtaining interface defect density ($D_{it}$) distribution at the sulfur-vapor passivated interface surface of the indium gallium arsenide layer at a record low level measured near mid gap across the band-gap.

A semiconductor fabrication process that uses the sulfur vapor-based passivation process, as will be described in more detail below, instead of using a liquid-based passivation process (e.g. using ammonium sulfide), can use higher sulfurization temperatures and sulfur that is more reactive. Therefore, the elemental sulfur-vapor passivation process, according to various embodiments of the present invention, is much more effective and enables the record low interface defect density. In addition, the vapor-based passivation process can be easily integrated into an InGaAs manufacturing process which is a vacuum process, to produce passivated InGaAs wafer or thin-film. The lower the defect density of the interface surface of, for example, a metal oxide semiconductor field effect transistor (MOSFET) device allows the transistors to operate with a higher speed and a lower power consumption. Also, the smoother the interface surface of the InGaAs semiconductor material layer the less carrier scattering and accordingly the higher speed from the MOSFET device.

It is to be understood that various embodiments of the present invention will be described in terms of an illustrative example process for fabricating semiconductor devices that utilize a passivated interface surface of an indium gallium arsenide layer on a semiconductor substrate. However, other semiconductor architectures, structures, substrate materials, and process features and steps can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present example embodiments include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used as part of a process in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications, to advanced computer products that may have a display, a keyboard or other input device, and a central processor, or to very high performance processing and/or communication equipment that operate at very high speed signaling and/or very low power consumption applications.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Various embodiments of the present invention include at least one semiconductor structure having III-V material (e.g., InGaAs semiconductor material), and any one or more of the following: a semiconductor device, a MOSFET device, a high electron mobility transistor (HEMT) device, a photovoltaic device, and a photodetector device, on the same wafer. This semiconductor structure can be part of an integrated circuit.

Referring now to the drawings in which like numerals represent the same of similar elements, FIGS. 1-4 illustrate an example of various process steps for fabricating a semiconductor structure 100 comprising a sulfur-passivated surface according to various embodiments of the present invention.

Figure 6:
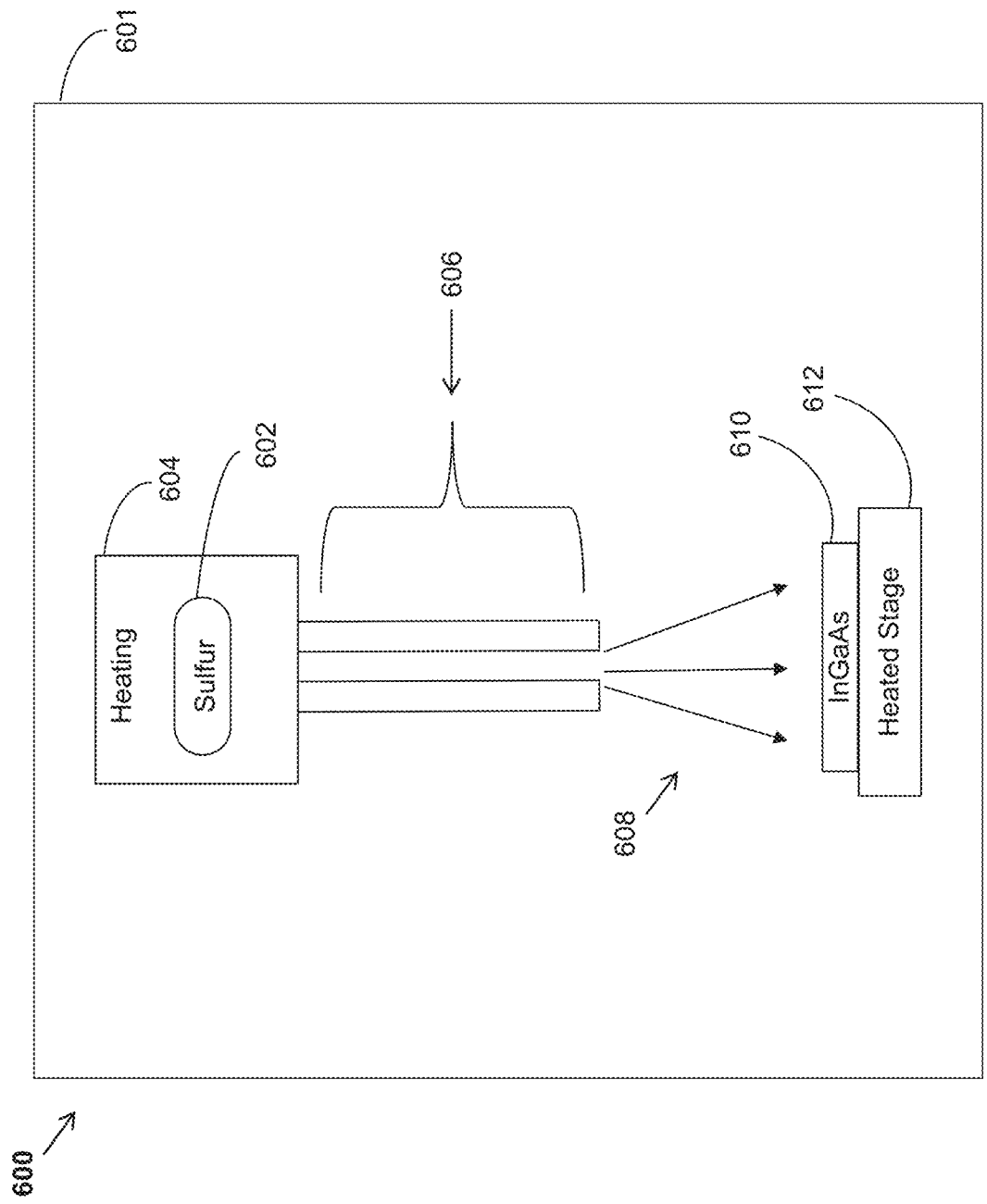
FIGS. 6-8 illustrate fabrication process equipment suitable for use with the fabrication processes illustrated in FIGS. 1-5, according to various embodiments of the present invention.

FIG. 1, according to the example, illustrates a semiconductor structure 100 comprising a substrate layer 102 and a III-V semiconductor material layer 104 disposed on the substrate layer 102. The substrate 102 can be any suitable lattice-matched or lattice-mismatched substrate material, such as, for example, indium phosphide (InP), single crystalline Si, SiGe, SiC, III-V compound semiconductor, II-VI compound semiconductor, or semiconductor-on-insulator (SOI). In some embodiments, the substrate 102 includes a buried oxide layer (not depicted). In some embodiments, the substrate 102 includes both an nFET region and a pFET region. In some embodiments, the substrate 102 includes either an nFET region or a pFET region. In one embodiment, the semiconductor material layer 104 is $In_xGa_{(1-x)}As$, where x is about 0.01 to about 0.99, and the semiconductor structure 100 may be part of an intrinsic InGaAs wafer. In some embodiments, the semiconductor layer 104 is $In_xGa_{1-x}As$, where x is about 0.53. In some embodiments, the semiconductor layer 104 has a thickness of about 4 nm to about 150 nm, although other thicknesses are within the contemplated scope of the invention. As shown, the semiconductor material layer 104 has an exposed top interface surface 105. The semiconductor structure 100, according to the example, can be located inside a vacuum chamber. The vacuum chamber can generate and maintain a high vacuum environment below $10^{-3}$ Torr in the vacuum chamber. Examples of such a vacuum chamber are illustrated in FIG. 6 (600), FIGS. 7 (702, 712, and 722), and FIG. 8 (722), and which will be discussed in more detail below.

At this point in a semiconductor fabrication process, the top interface surface 105 of the semiconductor material layer 104 is an untreated surface, which, normally if used in this condition in a semiconductor device without cleaning and passivation, would result in a semiconductor structure that is pinned and with a high interface defect density (on the order of about $10^{13}$ $cm^{-2}$ $eV^{-1}$ or greater). The high interface defect density of the interface surface 105 would detrimentally affect the performance parameters of a semiconductor device that included this semiconductor structure 100.

Figure 5:
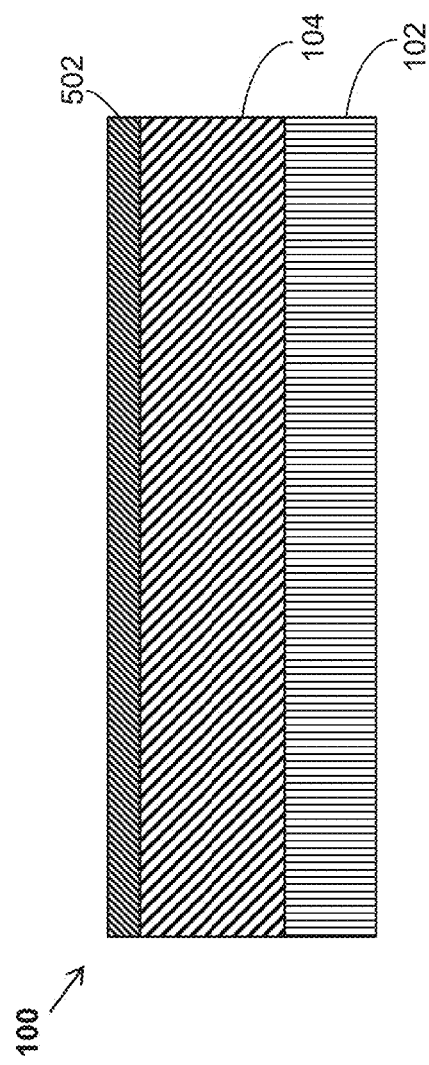
FIG. 5 is a cross-sectional side view of an example semiconductor structure in an ex-situ fabrication process, according to an embodiment of the present invention.

Just before this point in various semiconductor fabrication processes, as illustrated in FIG. 5, the semiconductor structure 100 may include a native oxide layer 502 often contaminated by organic compounds during a semiconductor structure sample handling process under non-vacuum conditions. This type of semiconductor fabrication is also referred to as an ex-situ fabrication process, which involves breaking a vacuum and handling the semiconductor structure 100 outside of a vacuum chamber, and thereby exposing the semiconductor structure 100 to ambient air that creates a native oxide layer 502 on the top interface surface 105 of the semiconductor material layer 104. Additionally, the exposed oxide layer during ex-situ handling of a semiconductor structure sample will likely become contaminated with organic contaminants. Therefore, in one embodiment, a sequential cleaning process is performing using, for example, acetone, methanol, and isopropyl alcohol (IPA). This process removes organic contaminants from the surface of the native oxide layer 502. The native oxide layer 502 is then removed by an oxide etching process thereby exposing the top interface surface 105 of the semiconductor material layer 104, as shown in FIG. 1. In one or more embodiments, for example, an ammonium hydroxide ($NH_4OH$) solution can be used to remove the native oxide layer 502 from the semiconductor material layer 104. For example, the native oxide layer 502 is contacted with a $NH_4OH$ solution. The $NH_4OH$ solution may be diluted in water, such as de-ionized water, to produce a solution having a desired concentration of $NH_4OH$ such as $NH_4OH:H_2O$ (1:1). The native oxide layer 502 is contacted with the $NH_4OH$ solution at room temperature (e.g., 20-25° C.) for two (2) minutes. In one embodiment, the oxide etch time can be 20 seconds or greater. In other embodiments, hydrochloric acid (HCl), hydrofluoric acid (HF), and/or the like can be used to remove the native oxide layer 502 from the semiconductor material layer 104. For HCl or HF, a 10% diluted solution in water may be used. At room temperature, an oxide etch time may be 20 seconds or greater. However, other dilutions and etch times are applicable as well. The surface oxide etch removal of the native oxide layer 502 creates an etched top interface surface 105 of the semiconductor material layer 104. This top interface surface 105 may have increased roughness, and increased defect density, resulting from the surface oxide etching process. The passivation process, as will describe below, will smooth out the roughness and reduce the defect density of this etched top interface surface 105.

According to a semiconductor fabrication process, the semiconductor structure 100 shown in FIG. 1 is located inside a vacuum chamber where an InGaAs material layer 104 has been grown in-situ on a semiconductor substrate 102. The vacuum chamber can generate and maintain a high vacuum environment below $10^{-3}$ Torr in the vacuum chamber. Typically, the semiconductor substrate 102 is part of a semiconductor wafer (not shown) that is located on a carrier inside the vacuum chamber. After the InGaAs material layer 104 has been grown in-situ on a semiconductor substrate 102, the top interface surface 105 is inherently exposed inside the vacuum chamber. The original roughness of the top interface surface 105 of the InGaAs material layer 104 is exposed and ready to be passivated in-situ, without breaking a vacuum, inside a vacuum chamber. Since the fabrication and passivation processes are integrated in-situ in a high vacuum condition below $10^{-3}$ Torr providing a highly clean ambient in at least one vacuum chamber, there is no need for a cleaning step and for an oxide etching step as was described above for the ex-situ fabrication process.

For example, the in-situ integrated processes prevent native surface oxidation of InGaAs interface surface 105 that would be inherently experienced by the top interface surface 105 of the InGaAs material layer 104 during an ex-situ fabrication process. The integrated fabrication and passivation processes while in-situ, without breaking vacuum, are performed in a vacuum condition that avoids the increased roughness and defect density created at the top interface surface 105 of the InGaAs material layer 104 from an ex-situ fabrication process as discussed above.

Each of the ex-situ fabrication process and the in-situ fabrication process can be performed with the passivation process as will be described more fully below. However, by integrating an in-situ fabrication process with an in-situ passivation process it provides significant advantages to a semiconductor fabrication operation. First, the number of overall fabrication steps are reduced which reduces overall costs and time for a fabrication process, and thereby enhancing commercial viability of the fabrication process. Second, by avoiding the cleaning step and etching step, following the in-situ growing of the InGaAs material layer 104 on the semiconductor substrate 102, the in-situ passivation process can more effectively smooth out the roughness of the exposed top interface surface 105 that includes only the original roughness (not the increased roughness resulting from the oxide etching). Accordingly, the in-situ passivation process can more effectively reduce the interface defect density for the top interface surface 105, which increases the performance parameters for the semiconductor structure 100 and for a semiconductor device that includes the semiconductor structure 100.

Figure 2:
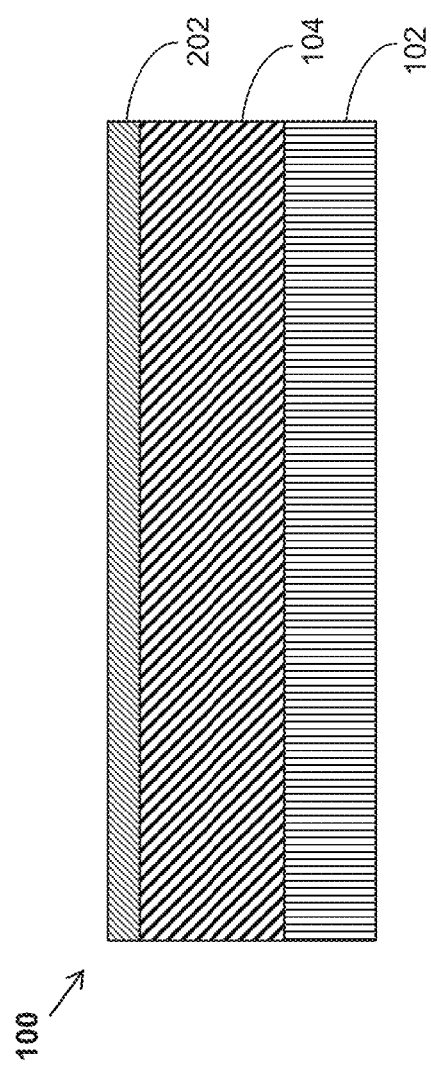

An example passivation process can be applied to a semiconductor structure 100, as illustrated in FIG. 2, resulting in a passivation layer 202 being formed on and in contact with the exposed top interface surface 105 of the InGaAs material layer 104. In one embodiment, a monolayer of sulfur is formed on the exposed top interface surface 105 with a thickness of approximately 0.4 nm. However, other thicknesses are applicable as well. In one embodiment, the passivation layer 202 comprises a sulfur passivation layer 202 formed by elemental sulfur-vapor deposition in a passivation vacuum chamber. According to one embodiment, the sulfur-vapor passivation process is integrated into a semiconductor fabrication process such that both processes are performed in-situ on the semiconductor structure 100. That is, the III-V material layer 104 (e.g., the InGaAs semiconductor material layer 104) is grown in a growth vacuum chamber in a high vacuum condition below $10^{-3}$ Torr providing a highly clean ambient in the growth vacuum chamber. Then, without breaking vacuum, the semiconductor structure 100 sample is transferred to a passivation chamber in a high vacuum condition below $10^{-3}$ Torr providing a highly clean ambient in the passivation vacuum chamber. In certain embodiments, the growth vacuum chamber and the passivation vacuum chamber are the same vacuum chamber that can generate and maintain a high vacuum level below $10^{-3}$ Torr to provide a highly clean ambient in the same vacuum chamber for an in-situ fabrication process integrated with an in-situ passivation process.

Figure 3:
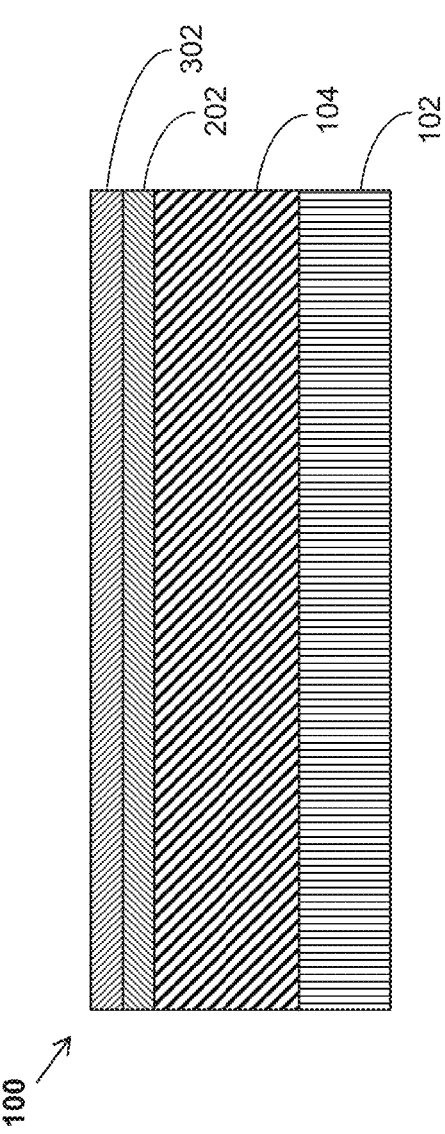

After the sulfur passivation film layer 202 is formed directly on the top interface surface 105 of the of the InGaAs material layer 104, additional one or more passivation layers 302 (as shown in FIG. 3, can optionally be deposited on the sulfur passivation film layer 202 to enhance the interface surface passivation effect on the semiconductor structure 100. For example, a nanometer-scale thickness passivation layer 302 comprising at least one material selected from the following: ammonium sulfide ($(NH_4)_2S$), hydrogenated amorphous silicon a-Si:H, gallium gadolinium oxide ($(Ga_2O_3)_{1-x}(Gd_2O_3)_x$, or GGO), zinc sulfide (ZnS), cadmium sulfide (CdS), and the like, can be optionally deposited on the sulfur-passivated surface 105 to further passivate the surface 105. A dielectric layer, such as the high-k dielectric layer 402 shown in FIG. 4, can be deposited and formed on the sulfur-passivated surface 105 by applying highly reactive precursors to the sulfur-passivated surface 105, or according to various embodiments to the nanometer-scale thickness passivation layer 302 disposed on the sulfur-passivated surface 105. The dielectric layer 402 can comprise a single layer or multiple layers of dielectric material that consist of one or more materials with dielectric constants greater than 2.5. The dielectric layer 402 can comprise a high-k dielectric material, such as Aluminum Oxide ($Al_2O_3$) and Hafnium Oxide ($HfO_2$).

Deposition of the dielectric layer 402 may be performed by various deposition techniques including, but not limited to, atomic layer deposition (ALD), chemical vapor deposition (CVD), physical vapor deposition (PVD), molecular beam deposition (MBD), pulsed laser deposition (PLD), or liquid source misted chemical deposition (LSMCD).

Figure 10:
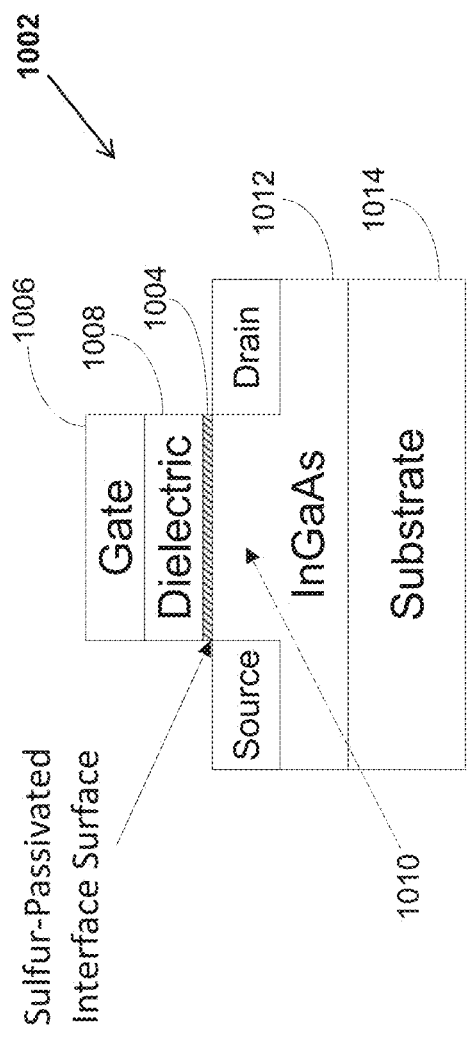
FIG. 10 is a cross-sectional side view of an example FET device according to an embodiment of the present invention.

An example semiconductor device 1002 fabricated according to the novel semiconductor fabrication processes described herein is shown in FIG. 10.

The semiconductor device 1002 may be, for example, a MOSFET 1002 that includes a sulfur passivation film layer 1004 on an InGaAs layer 1012. This sulfur passivation layer 1004 can also be referred to as a sulfur-passivated interface surface 1004 of a channel portion 1010 of an InGaAs layer 1012 of the MOSFET 1002. The InGaAs layer 1012 includes a source region and a drain region as shown in FIG. 10. According to the example, a gate stack is formed on the channel portion 1010 of the MOSFET transistor 1002. The gate stack includes a gate 1006, which includes contact metallization and optionally includes other layers of semiconductor material, and a high-k dielectric layer 1008 that is directly disposed on the sulfur-passivated interface surface 1004. This sulfur-passivated interface surface 1004, resulting from the novel semiconductor fabrication process as will be discussed more fully below, exhibits a measurable level of surface defect density ($D_{it}$) distribution of less than $2 \times 10^{11}$ $eV^{-1}$ $cm^{-2}$ measured near mid gap across the bandgap. This technical advantage in reduced surface defect density ($D_{it}$) distribution and accordingly significantly improved semiconductor device performance parameters (e.g., very high speed, low noise, and very low power consumption) can be obtained by the present methods of semiconductor manufacture.

Figure 7:
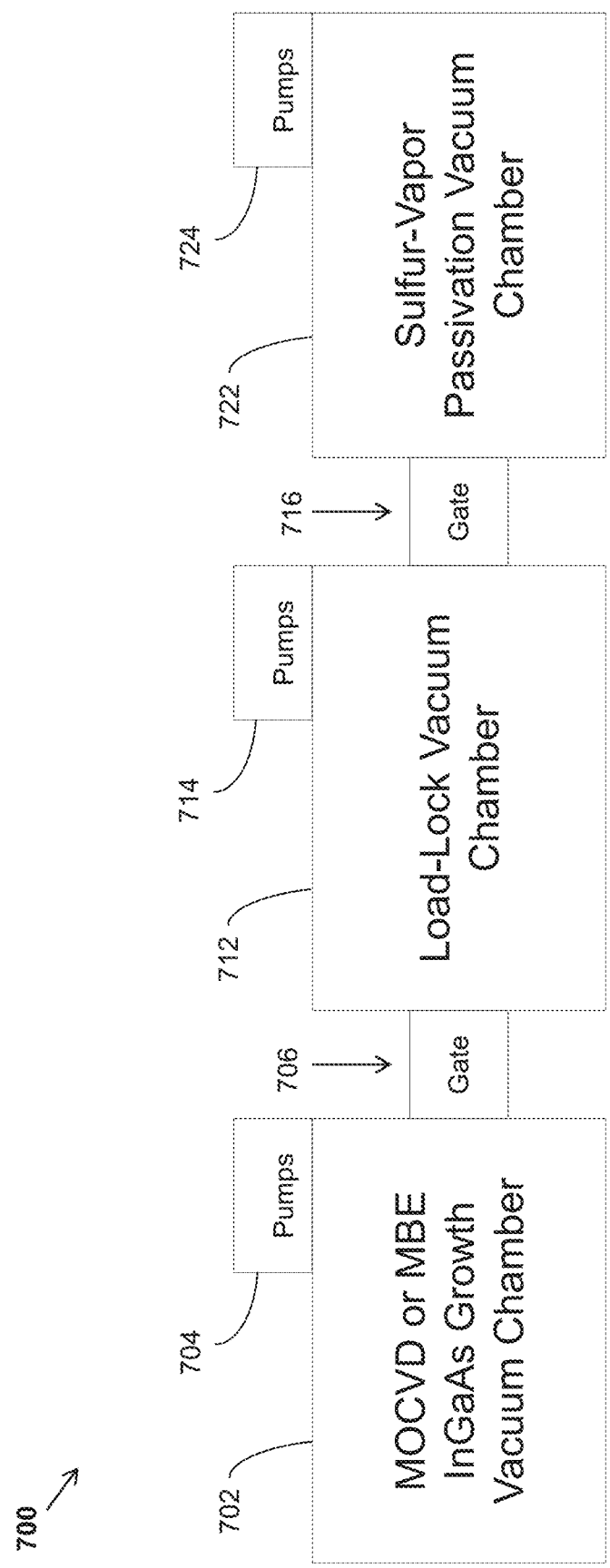

FIG. 7 illustrates an example of the novel semiconductor fabrication equipment 700 that can be used to integrate the sulfur-vapor passivation process into a semiconductor fabrication process such that both processes are performed in-situ on the semiconductor structure 100 without breaking a vacuum. A first vacuum chamber 702 in a fabrication process is used to grow the InGaAs layer 104 on the substrate layer 102 of the semiconductor structure 100. In the present example, the first vacuum chamber 702 can also be referred to as a growth vacuum chamber 702. The semiconductor structure 100 is part of a product sample located on a substrate carrier or holder (not shown in FIG. 7) inside the first vacuum chamber 702. The product sample, for example, may be a wafer on which the fabrication process can manufacture a large number of semiconductor structures 100. A first set of vacuum pumps 704 is controlled by a fabrication controller (not shown) to create and maintain a vacuum (or near vacuum) condition in the first vacuum chamber 702. A Metal-Organic Chemical Vapor Deposition (MOCVD) process or a Molecular Beam Epitaxy (MBE) process can be used to grow the InGaAs film layer 104 on the substrate layer 102 in the vacuum chamber 702. The MOCVD process, for example, uses a metal organic precursor vapor that is applied to the substrate layer 102 in the growth vacuum chamber 702 to grow the InGaAs film layer 104 on the substrate layer 102 of the semiconductor structure 100. The MOCVD process and the MBE process are known processes for fabrication of a InGaAs film layer on a semiconductor structure 100.

The product sample, including the InGaAs film layer 104 on the substrate layer 102 of the semiconductor structure 100, can then be transferred to a second vacuum chamber 712, which in the present example can also be referred to as a Load-Lock vacuum chamber 712. Specifically, a second set of vacuum pumps 714 is controlled by the fabrication controller to purge out gas from the Load-Lock vacuum chamber 712 to create and maintain a vacuum (or near vacuum) condition in the second vacuum chamber 712. The first gate 706 is then opened and the product sample is transferred from the growth vacuum chamber 702 to the second vacuum chamber 712. The first gate 706 is then locked to maintain the vacuum (or near vacuum) condition in the second vacuum chamber 712, independent of the first vacuum chamber 702. The product sample can be transferred via a robotic or automatic transfer arm that picks up a substrate carrier or holder, supporting the semiconductor structure 100, in the first vacuum chamber passes it through the first gate 706 and deposits the substrate carrier or holder in the second vacuum chamber 712. Other alternative forms of transporting the semiconductor structure 100 from the first vacuum chamber 702 to the second vacuum chamber 712 are anticipated according to the present example fabrication process.

A third vacuum chamber 722, which is also referred to in the present example as a passivation chamber 722, is communicatively coupled with the Load-Lock vacuum chamber 712 via a second gate 716. With the semiconductor structure 100 in the Load-Lock vacuum chamber 712, a third set of vacuum pumps 724 is controlled by the fabrication controller to create and maintain a vacuum (or near vacuum) condition in the third vacuum chamber 722. According to the example fabrication process, the second gate 716 is then opened. The product sample supported on the substrate carrier or holder is then picked-up and transferred by a robotic or automatic transfer arm from the Load-Lock vacuum chamber 712. The robotic or automatic transfer arm passes the substrate carrier or holder through the second gate 716, and deposits the substrate carrier or holder into the passivation chamber 722. The second gate 716 is then locked to maintain the vacuum (or near vacuum) condition in the third vacuum chamber 722, independent of the second vacuum chamber 712.

The passivation process, performed in the passivation chamber 722, applies in-situ, without breaking a vacuum, a sulfur-vapor deposition of reactive sulfur vapor particles on the inherently exposed top interface surface 105 of the indium gallium arsenide semiconductor material layer 104 of the semiconductor structure 100. The sulfur-vapor deposition forms a monolayer of sulfur on the top interface surface 105 that passivates the interface surface 105 and smoothes out the roughness of the interface surface. This in-situ integrated combination of semiconductor fabrication and passivation process significantly reduces the number of process steps required to fabricate semiconductor devices while obtaining surface defect density ($D_{it}$) distribution at the sulfur-vapor passivated interface surface 105 of the indium gallium arsenide layer 104 at a record low level of less than $2 \times 10^{11}$ eV$^{-1}$ cm$^{-2}$ measured near mid gap across the band-gap. This sulfur vapor passivation process significantly reduces a surface defect density of the interface surface 105 of the InGaAs semiconductor material layer 104, and improves the semiconductor structure 100 (and the semiconductor device) performance parameters such as operation at very high speed, low noise, and very low power consumption.

An example sulfur-vapor passivation process will be discussed in more detail below. As illustrated in FIG. 6, an example of semiconductor fabrication equipment 600 is shown. A sulfur-passivation vacuum chamber 601 is shown with a sample product including an InGaAs semiconductor structure 610 with a top interface surface of an InGaAs layer exposed inside the vacuum chamber under vacuum (or near vacuum) condition. A substrate holder or carrier 612 is supporting the semiconductor structure 610. The substrate holder or carrier 612 can be heated, by a heating element under control from a fabrication controller (not shown), to thereby apply heat to the InGaAs semiconductor structure 610.

A heating compartment 604 in the vacuum chamber 601 contains a solid sulfur source 602. The solid sulfur source 602 is heated in the heating compartment 604 to a temperature of approximately between 150° C. and 200° C., which creates elemental reactive sulfur vapor as a sulfur source in the vacuum chamber 601. This is a thermally-cracked (activated) pure elemental sulfur vapor flux at a high vacuum level, which doesn't require any carrier gases.

The sulfur vapor passes from the heating compartment 604 through a cracking zone channel 606 that directs the exiting elemental sulfur vapor flux 608 toward the top exposed interface surface of the indium gallium arsenide layer of the semiconductor structure 610. The exiting sulfur elemental vapor flux 608 travels in substantially straight line direction toward the exposed interface surface and without being diffused because of the vacuum (or near vacuum) condition in the vacuum chamber 601. That is, there is no ambient atmosphere in the vacuum chamber 601 that can interfere, diffuse, and scatter, the elemental sulfur vapor flux 608 exiting the cracking zone channel 606. In one embodiment, the cracking zone channel is in the form of one or more cylindrical pipes that are heated selectively by heating elements under control of the fabrication controller to obtain a cracking temperature of approximately between 200° C. and 800° C., and preferably between 700° C. and 800° C. This higher temperature in the cracking zone channel 606 will heat up the sulfur vapor 608 going through the cracking zone channel 606 to produce more reactive sulfur vapor particles. For example, elemental sulfur $S_8$ is cracked into more reactive sulfur particles $S$, $S_2$, $S_3$, $S_4$, etc. The more reactive sulfur vapor flux 608 sulfurization creates a passivating sulfur film layer adhered to the top interface surface of the indium gallium arsenide layer. This provides passivation treatment of the top interface surface of the InGaAs layer that is exposed inside the vacuum chamber 601 under vacuum (or near vacuum) condition.

Figure 8:
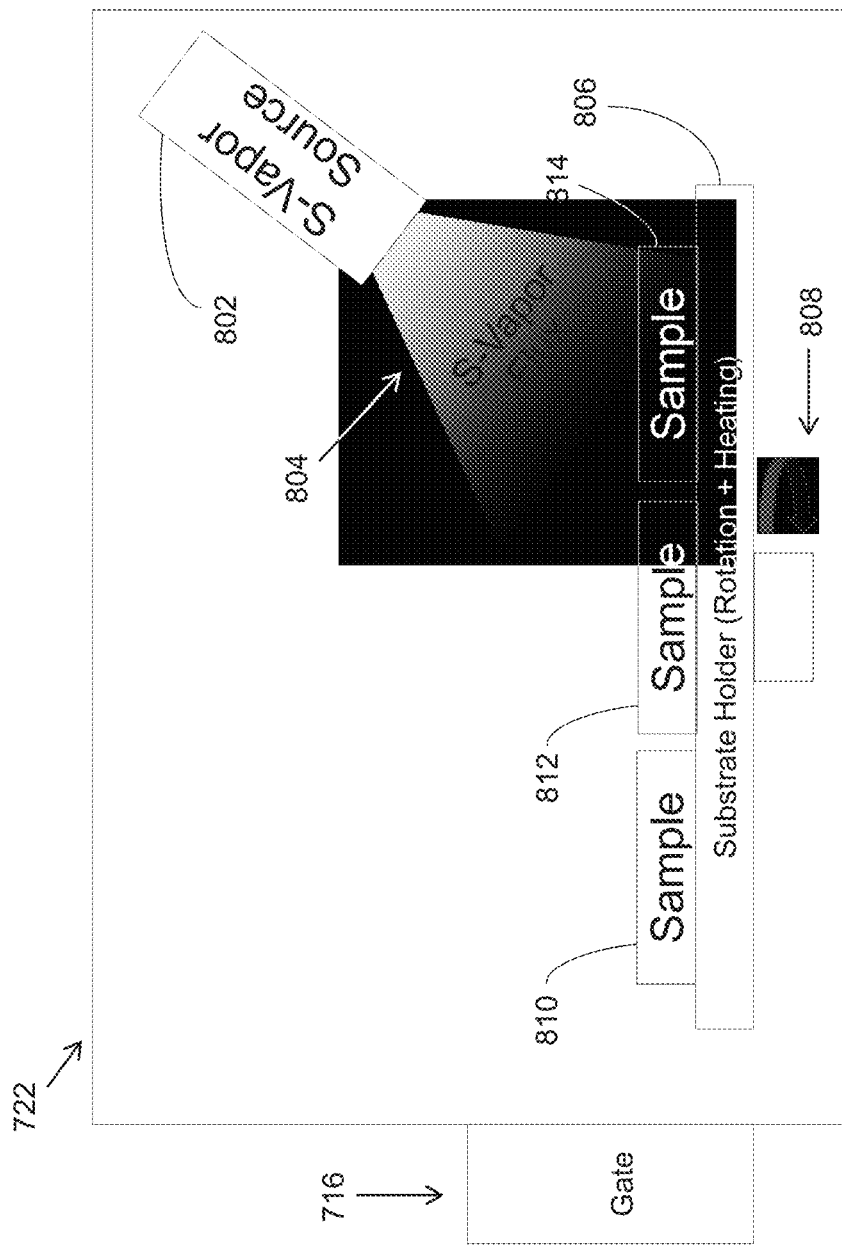

FIG. 8 illustrates an example passivation process utilizing novel semiconductor fabrication equipment, according to various embodiments of the present invention. This passivation process is illustrated being performed inside the sulfur vapor passivation vacuum chamber 722 shown in FIG. 7. After the second gate 716 is locked to maintain the vacuum (or near vacuum) condition in the passivation vacuum chamber 722, one or more product samples 810, 812, 814, are supported on a substrate carrier or holder 806 (which can also be referred to as a rotatable platform 806) in a work area inside the passivation vacuum chamber 722 as shown in FIG. 8. A heating element in contact with the substrate carrier or holder 806, and under control of the fabrication controller, can provide heat to the at least one substrate held by the substrate holder in the work area in the vacuum chamber 722 to promote sulfurization reaction of cracked sulfur vapor flux deposited onto the exposed interface surface of the indium gallium arsenide layer disposed on each of the at least one substrate held by the substrate holder.

The substrate carrier or holder 806, (which can be supported by a rotatable platform and/or be also referred to as the rotatable platform 806) is supported by a rotationally driven spindle 808 that can, under control of the fabrication controller, be selectively rotated to vary a location of one or more product samples 810, 812, 814, supported on the rotatable platform 806, relative to a sulfurization foot print created by the reactive sulfur vapor flux particles 804 exiting the cracking zone channel 802. The cracking zone channel 802 in FIG. 8 operates similar to the cracking zone channel 606 that has been discussed above with reference to FIG. 6.

The exiting sulfur vapor flux 804 travels substantially in a straight line direction toward the one or more product samples 810, 812, 814, on the rotatable platform 806 in the work area. While some of the product samples, such as the product sample 814, may be located in direct line with, and under the coverage foot print of, the exiting sulfur vapor flux 804, other product samples, such as the product sample 810, may be located out of direct line, and outside the coverage foot print, of the exiting sulfur vapor flux 804. This is illustrated in FIG. 8. By the fabrication controller selectively rotating the spindle 808 it likewise causes rotation of the rotatable platform 806. The rotation of the substrate carrier or holder (rotatable platform) 806 will cause change in the location of the one or more product samples 810, 812, 814, in the work area in the vacuum chamber 722. The fabrication controller can track the precise location of each product sample on the substrate carrier or holder 806 inside the passivation vacuum chamber 722. A change in the location of each product sample in the work area in the vacuum chamber 722 can be accurately controlled by the fabrication controller by rotation of the rotatable platform 806. Such change in location can selectively locate one or more product samples under the direct coverage footprint of the exiting sulfur vapor flux 804. By moving all of the product samples to be at some time interval under the direct coverage footprint of the exiting sulfur vapor flux 804, it more evenly covers the exposed top interface surfaces of the respective indium gallium arsenide layers of the semiconductor structures in the product samples 810, 812, 814. The controlled rotation of the product samples 810, 812, 814, in the vacuum chamber 722 to locate each of the product samples under the direct coverage footprint of the exiting sulfur vapor flux 804 improves the sulfurization coverage of the exposed top interface surfaces of the respective InGaAs layers of the semiconductor structures in the product samples 810, 812, 814. In addition, by using the above described controlled rotation semiconductor fabrication equipment, a smaller passivation vacuum chamber 722 can be used in a semiconductor fabrication process.

A second alternative arrangement for a passivation vacuum chamber 722 would utilize a tall passivation vacuum chamber 722 with the output of the cracking zone channel 802 being located near the top of the inner chamber aimed downward. See FIG. 6 for an example of this second alternative arrangement for a passivation vacuum chamber 601. In this way, little to no movement of the product samples 810, 812, 814, would be necessary inside the passivation vacuum chamber 722 while having all of the product samples substantially under the coverage footprint of the exiting sulfur vapor flux 804. This alternative passivation process utilizing the second alternative arrangement for the passivation vacuum chamber 722, would increase the height of the vacuum chamber 722 but would not need to move the product samples 810, 812, 814, inside the vacuum chamber 722 to obtain complete sulfurization coverage on all the product samples. It may additionally shorten the time for a passivation process thereby speeding up an overall semiconductor fabrication process.

After the sulfur passivation of the top interface surfaces of the respective InGaAs layers of the semiconductor structures in the product samples 810, 812, 814, the fabrication process can continue in-situ, either in the same vacuum chamber 722 or in a subsequent vacuum chamber communicatively coupled with the passivation vacuum chamber 722.

For example, after a first sulfur passivation film layer is formed directly on the top interface surface of the of the InGaAs material layer of the semiconductor structures in the product samples 810, 812, 814, additional one or more passivation layers (such as the second passivation layer 302 shown in FIG. 3) can optionally be deposited on the first sulfur passivation film layer to enhance the interface surface passivation effect on the semiconductor structure. For example, a nanometer-scale thickness passivation layer 302 comprising at least one material selected from the following: ammonium sulfide (($NH_4$)$_2$S), hydrogenated amorphous silicon a-Si:H, gallium gadolinium oxide (($Ga_2O_3$)$_{1-x}$ ($Gd_2O_3$)$_x$, or GGO), zinc sulfide (ZnS), cadmium sulfide (CdS), and the like, can be optionally deposited on the sulfur-passivated surface to further passivate the surface of the InGaAs material layer.

Figure 4:
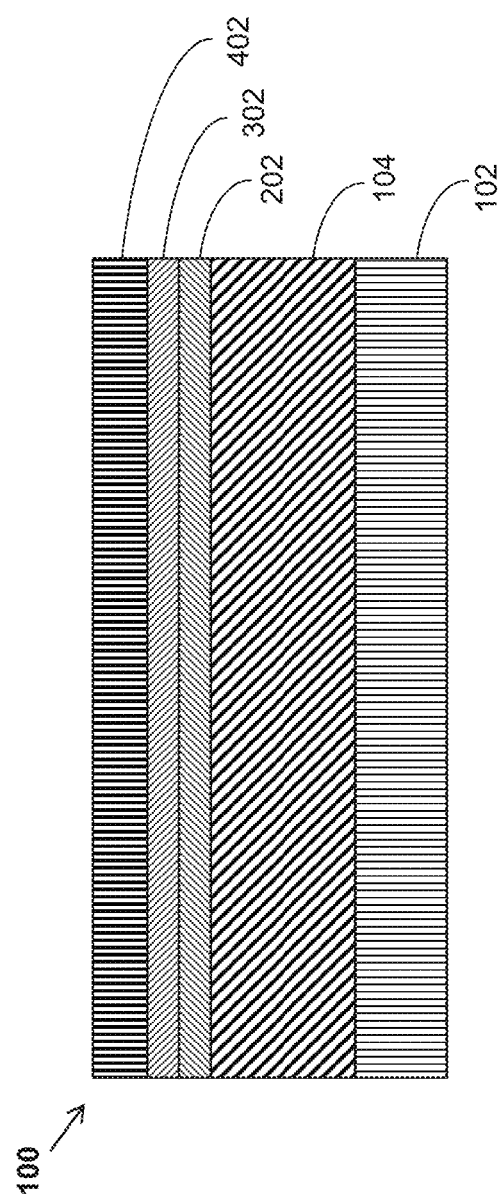

Additionally, a high-k dielectric layer, such as shown in FIG. 4, can be deposited and formed on the sulfur-passivated interface surface by applying highly reactive precursors to the sulfur-passivated surface, or applying highly reactive precursors to the nanometer-scale thickness second passivation layer disposed on the first sulfur-passivated interface surface according to various embodiments. The dielectric layer can comprise a single layer or multiple layers consisting of one or more materials with dielectric constants greater than 2.5. The dielectric layer can consist of one or more high-k dielectric materials, such as Aluminum Oxide ($Al_2O_3$) and Hafnium Oxide ($HfO_2$).

The semiconductor dielectric stack, such as shown in FIG. 4, in each semiconductor structure of the product samples 810, 812, 814, is optionally annealed under forming gas ambient. This can be done inside a vacuum chamber in, for example, the in-situ semiconductor fabrication process as has been discussed above. An optional annealing process can be performed to anneal the semiconductor structures in the product samples 810, 812, 814. In one embodiment, the optional annealing process can be applied to the semiconductor structures while in a forming gas (e.g., a mixture of hydrogen (5%) and nitrogen) and with anneal temperature ranging from 200° C. to 400° C. In one embodiment the anneal temperature is in the range of greater than 300° C. In one embodiment, a tube furnace with a constant gas flow rate of ~5 sccm under atmosphere pressure is utilized. However, other annealing processes and temperatures are applicable as well. The annealing process further passivates defects at the interface surfaces of the InGaAs layers in the semiconductor structures since the hydrogen in the forming gas binds with the defects.

Subsequent fabrication processes are performed to form one or more semiconductor structures in respective semiconductor devices as discussed above. An example semiconductor device 1002 fabricated according to the novel semiconductor fabrication processes described above is shown in FIG. 10, which has been discussed above.

For example, optoelectronic devices such as lasers, light emitting diodes, and photovoltaic devices may be fabricated using the semiconductor structure 100. The sulfur passivation of the interface surface, according to the discussion above, allows more photons to be emitted such that high external efficiency is achieved. The large surface area of light emitting diodes benefits from the surface passivation, which results in higher light emission efficiency. In conventional photovoltaic devices, photo-generated carrier will drift and diffuse toward two electrodes with high recombination occurring at the interface surface of the semiconductor structure due to higher defect density (dangling bonds) at the interface surface. However, the sulfur passivation of the interface surface as discussed above, allows for high short circuit current, larger open-circuit voltage, and overall larger output power.

Figure 9:
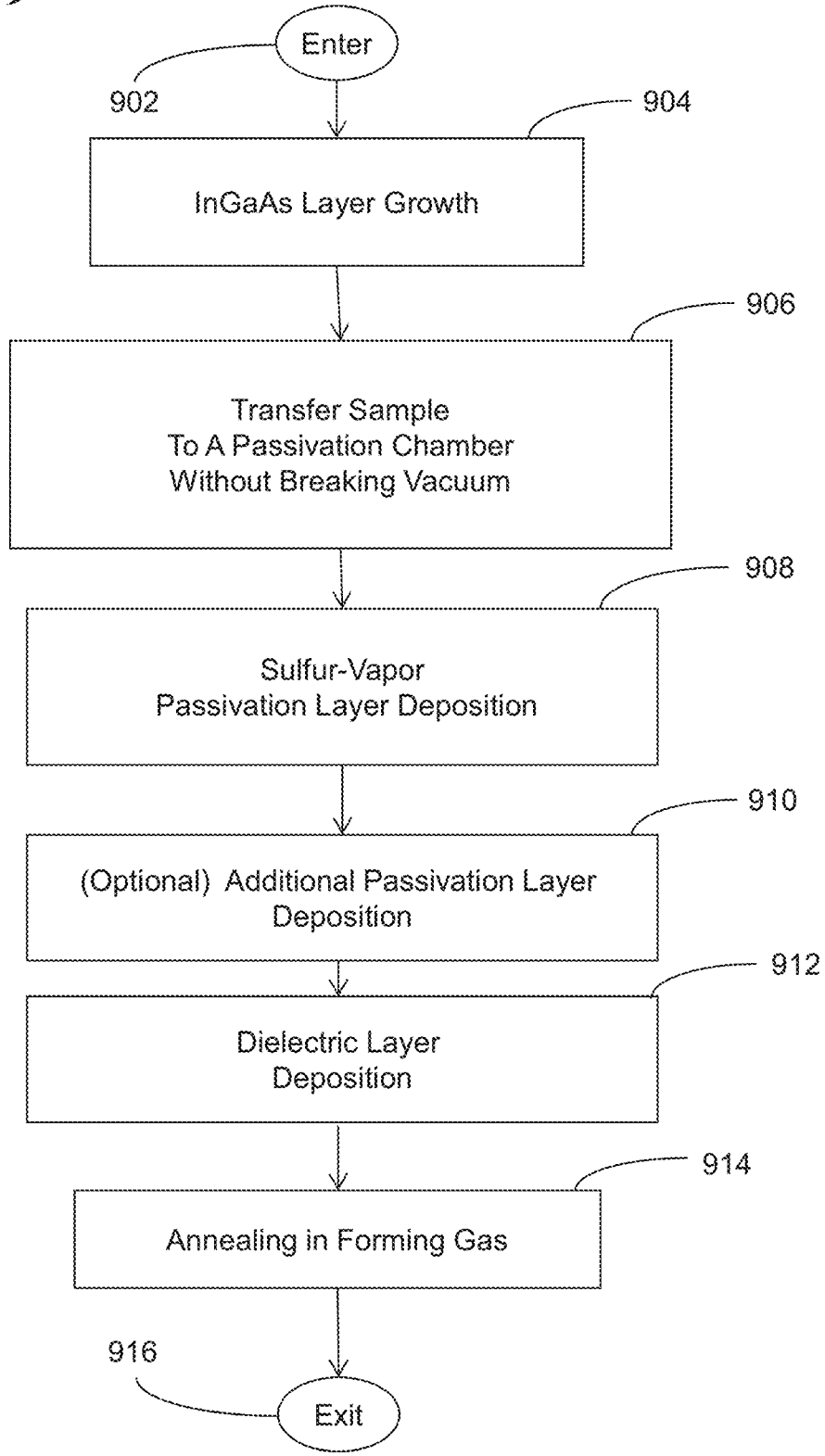
FIG. 9 is an operational flow diagram illustrating one example process for fabricating a semiconductor structure according to an embodiment of the present invention.

FIG. 9 is an operational flow diagram illustrating one process for fabricating a semiconductor structure comprising a sulfur-vapor passivated interface surface, as has been discussed above. In FIG. 9, the operational flow diagram begins at step 902 and flows directly to step 904. It should be noted that each of the steps shown in FIG. 9 have been discussed above with respect to FIGS. 1-8. In a growth vacuum chamber 702, at step 904, an InGaAs material layer 104 is grown on a semiconductor substrate 102 in a semiconductor structure 100. Optionally, in an ex-situ fabrication process, a native oxide layer 502 (see FIG. 5) is removed from a top interface surface 105 of the InGaAs material layer 104, before proceeding with the fabrication process, at step 904. In an in-situ fabrication process, following the growth of the InGaAs material layer 104 on the semiconductor substrate 102 in a semiconductor structure 100 inside a vacuum chamber 702, an in-situ passivation process on the semiconductor structure 100 can be performed, without breaking vacuum, in a passivation chamber 722. The product sample with the semiconductor structure 100 is transferred, at step 906, into a passivation chamber 722. In the case of an in-situ semiconductor fabrication process integrated with an in-situ passivation process, the product sample with the semiconductor structure 100 is transferred, at step 906, into a passivation chamber 722, without breaking vacuum.

Reactive sulfur vapor deposition, at step 908, on the top interface surface 105 of the InGaAs material layer 104 effectively passivates the interface surface 105 by forming a sulfur film layer on the interface surface 105. The sulfurization process by sulfur vapor deposition has been discussed above. The passivation layer is formed in direct contact with the exposed top interface surface of the InGaAs layer in the semiconductor structure 100. An optional additional passivation layer deposition is performed, at step 910. A hi-k dielectric layer is formed, at step 912, on the sulfur passivated interface surface of the InGaAs material layer 104. The semiconductor structure 100, including the hi-k dielectric layer and the sulfur vapor passivation layer, is then annealed in forming gas, at step 914. The annealing of the semiconductor structure 100 can be done in hydrogen containing ambient at a temperature greater than 300° C. to obtain a minimum of $D_{it}$ defect density distribution, in the range of less than $2\times10^{11}$ eV$^{-1}$ cm$^{-2}$ measured near mid gap across the band-gap. Specifically, the $D_{it}$ values are characterized by C-V (capacitance vs. voltage) and G-p (conductance vs. frequency) measurements at 300 K with a various frequency to map the $D_{it}$ defect density distribution and the lowest $D_{it}$ values measured near mid gap across a band-gap. The control flow then exits at step 916.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

It should be noted that some features of the present invention might be used in one embodiment thereof without use of other features of the present invention. As such, the foregoing description should be considered as merely illustrative of the principles, teachings, examples, and exemplary embodiments of the present invention, and not a limitation thereof.

Also, these embodiments are only examples of the many advantageous uses of the innovative teachings herein. In general, statements made in the specification of the present application do not necessarily limit any of the various claimed inventions. Moreover, some statements may apply to some inventive features but not to others.

What is claimed is:

1. An apparatus for in-situ sulfur-vapor passivation of an interface surface of an indium gallium arsenide layer of a semiconductor structure, the apparatus comprising:
   at least one vacuum chamber equipped with a set of vacuum pumps, controllable by a fabrication controller, for generating and maintaining a high vacuum environment below $10^{-3}$ Torr in the at least one vacuum chamber, the at least one vacuum chamber having a main chamber compartment for sulfur-vapor passivation of an interface surface of an indium gallium arsenide layer disposed on a substrate located in a work area in the main chamber compartment;
   a sulfur source heating chamber compartment for heating a material comprising sulfur to a temperature of at least 150° C. to generate thermally-cracked pure sulfur vapor flux in the sulfur source heating chamber;
   a sulfur vapor thermally cracking zone channel mechanically coupled at one end to the sulfur source heating chamber compartment and an output end of the sulfur vapor thermally cracking zone channel extending away from the sulfur source heating chamber compartment, the sulfur vapor thermally cracking zone channel providing a thermally-cracked pure sulfur vapor flux coupling channel for transferring the thermally-cracked pure sulfur vapor flux generated in the sulfur source heating chamber compartment to the work area in the main chamber compartment, the sulfur vapor thermally cracking zone channel for heating the thermally-cracked pure sulfur vapor flux transferred through the sulfur vapor thermally cracking zone channel to a temperature of at least 700° C. to generate a highly reactive thermally-cracked pure sulfur vapor flux that is more reactive than the thermally-cracked pure sulfur vapor flux generated in the sulfur source heating chamber; and
   a substrate holder in the work area in the main chamber compartment of the at least one vacuum chamber, the substrate holder for holding, in the work area, at least one substrate with an indium gallium arsenide layer disposed on each of the at least one substrate, the indium gallium arsenide layer having an exposed interface surface, and the output end of the sulfur vapor thermally cracking zone channel being aimed toward the substrate holder in the work area in the main chamber compartment to uniformly distribute the highly reactive thermally-cracked pure sulfur vapor flux from the output end directly onto the exposed interface surface of the indium gallium arsenide layer disposed on each of the at least one substrate held by the substrate holder in the work area in the main chamber compartment of the at least one vacuum chamber.

2. The apparatus of claim 1, wherein the substrate holder comprises:
   a heating element to heat the at least one substrate held by the substrate holder in the work area, to promote sulfurization reaction of thermally-cracked pure sulfur vapor flux deposited onto the exposed interface surface of the indium gallium arsenide layer disposed on each of the at least one substrate held by the substrate holder; and
   a rotationally driven spindle supporting a rotatable platform that supports the substrate holder, for:
      holding in the work area the at least one substrate by the substrate holder and supported by the rotatable platform, and
      rotating the rotatable platform and thereby rotating the substrate holder and the at least one substrate held in the work area to move the exposed interface surface, of the indium gallium arsenide layer disposed on each of the at least one substrate, across a thermally-cracked pure sulfur vapor flux output field emitted from the output end of the sulfur vapor thermally cracking zone channel, to uniformly distribute the highly reactive thermally-cracked pure sulfur vapor flux from the output directly onto the exposed interface surface of the indium gallium arsenide layer disposed on each of the at least one substrate held by the substrate holder.

3. The apparatus of claim 1, wherein the semiconductor structure comprises:
   a substrate;
   one or more III-V layers disposed on the substrate, with a surface layer of indium gallium arsenide having an interface surface; and
   a sulfur film layer disposed directly on, and passivating, the interface surface of the surface layer of indium gallium arsenide, the sulfur passivated interface surface of the surface layer of indium gallium arsenide having an interface defect density ($D_{it}$) distribution of less than $2\times10^{11}$ eV$^{-1}$ cm$^{-2}$ measured near mid gap across a band-gap.

4. The apparatus of claim 3, wherein a high-k dielectric single layer having a dielectric constant greater than 2.5, is disposed directly on the sulfur film layer disposed directly on the sulfur vapor passivated interface surface of the surface layer of indium gallium arsenide.

5. The apparatus of claim 3, wherein the semiconductor structure comprises:

a high-k dielectric layer disposed directly on the sulfur film layer disposed directly on the sulfur passivated interface surface of the surface layer of indium gallium arsenide.

6. The apparatus of claim 5, wherein the high-k dielectric layer comprises multiple layers of one or more dielectric materials with dielectric constants greater than 2.5.

7. The apparatus of claim 3, wherein the semiconductor structure comprises:
an additional passivation layer disposed directly on the sulfur film layer disposed directly on the sulfur passivated interface surface of the surface layer of indium gallium arsenide, wherein the additional passivation layer comprises at least one material selected from the following:
ammonium sulfide ($(NH_4)_2S$),
hydrogenated amorphous silicon (a-Si:H),
gallium gadolinium oxide ($(Ga_2O_3)_{1-x}(Gd_2O_3)_x$, or GGO),
zinc sulfide (ZnS), and
cadmium sulfide (CdS),
to further passivate the sulfur passivated interface surface of the surface layer of indium gallium arsenide.

8. The apparatus of claim 3, wherein the surface layer of indium gallium arsenide comprises $In_xGa_{1-x}As$ ($0 \leq x \leq 1$).

9. A method for fabricating a semiconductor structure, the method comprising:
controlling, by a fabrication controller, at least one vacuum chamber equipped with a set of vacuum pumps, for generating and maintaining a high vacuum environment below $10^{-3}$ Torr in the at least one vacuum chamber, the at least one vacuum chamber having a main chamber compartment for sulfur-vapor passivation of an interface surface of an indium gallium arsenide layer disposed on a substrate located in a work area in the main chamber compartment;
heating, by a sulfur source heating chamber compartment, a material comprising sulfur to a temperature of at least 150° C. to generate a thermally-cracked pure sulfur vapor flux in the sulfur source heating chamber;
transferring the thermally-cracked pure sulfur vapor flux generated in a sulfur source heating chamber compartment through a sulfur vapor thermally cracking zone channel to the work area in the main chamber compartment;
heating the thermally-cracked pure sulfur vapor flux while transferred through the sulfur vapor thermally cracking zone channel to a temperature of at least 700° C. to generate highly reactive thermally-cracked pure sulfur vapor flux that is more reactive than the thermally-cracked pure sulfur vapor flux generated in the sulfur source heating chamber; and
holding, by a substrate holder in the work area, at least one substrate with an indium gallium arsenide layer disposed on each of the at least one substrate, the indium gallium arsenide layer having an exposed interface surface, such that an output end of the sulfur vapor thermally cracking zone channel is aimed toward the substrate holder in the work area in the main chamber compartment to uniformly distribute the highly reactive thermally-cracked pure sulfur vapor flux from the output directly onto the exposed interface surface of the indium gallium arsenide layer disposed on each of the at least one substrate held by the substrate holder in the work area in the main chamber compartment of the at least one vacuum chamber.

10. The method of claim 9, further comprising:
heating, by a heating element in the substrate holder, the at least one substrate held by the substrate holder in the work area, to promote sulfurization reaction of thermally-cracked pure sulfur vapor flux deposited onto the exposed interface surface of the indium gallium arsenide layer disposed on each of the at least one substrate held by the substrate holder; and
holding in the work area the at least one substrate by the substrate holder being supported by a rotatable platform, and
rotating the rotatable platform and thereby rotating the substrate holder and the at least one substrate held in the work area to move the exposed interface surface, of the indium gallium arsenide layer disposed on each of the at least one substrate, across a thermally-cracked pure sulfur vapor flux output field emitted from the output end of the sulfur vapor thermally cracking zone channel, to uniformly distribute the highly reactive thermally-cracked pure sulfur vapor flux from the output directly onto the exposed interface surface of the indium gallium arsenide layer disposed on each of the at least one substrate held by the substrate holder.

11. The method of claim 9, wherein the method is for fabricating a semiconductor structure comprising:
a substrate;
one or more III-V layers disposed on the substrate, with a surface layer of indium gallium arsenide having an interface surface; and
a sulfur film layer disposed directly on, and passivating, the interface surface of the surface layer of indium gallium arsenide, the sulfur passivated interface surface of the surface layer of indium gallium arsenide having an interface defect density ($D_{it}$) distribution of less than $2 \times 10^{11}$ $eV^{-1}$ $cm^{-2}$ measured near mid gap across a band-gap.

12. The method of claim 11, wherein the method is for fabricating the semiconductor structure further comprising a high-k dielectric single layer having a dielectric constant greater than 2.5, disposed directly on the sulfur film layer disposed directly on the sulfur vapor passivated interface surface of the surface layer of indium gallium arsenide.

13. The method of claim 11, wherein the method is for fabricating the semiconductor structure further comprising:
a high-k dielectric layer disposed directly on the sulfur film layer disposed directly on the sulfur passivated interface surface of the surface layer of indium gallium arsenide.

14. The method of claim 9, wherein the method is for fabricating the semiconductor structure further comprising:
an additional passivation layer disposed directly on the sulfur film layer disposed directly on the sulfur passivated interface surface of the surface layer of indium gallium arsenide, wherein the additional passivation layer comprises at least one material selected from the following:
ammonium sulfide ($(NH_4)_2S$),
hydrogenated amorphous silicon (a-Si:H),
gallium gadolinium oxide ($(Ga_2O_3)_{1-x}(Gd_2O_3)_x$, or GGO),
zinc sulfide (ZnS), and
cadmium sulfide (CdS),
to further passivate the sulfur passivated interface surface of the surface layer of indium gallium arsenide.

15. The method of claim 9, wherein the method is for fabricating the semiconductor structure wherein the surface layer of indium gallium arsenide comprises $In_xGa_{1-x}As$ ($0 \leq x \leq 1$).

16. The method of claim 9, wherein the method is performed for fabricating at least one device selected from the following set of devices:
- a semiconductor wafer including at least one semiconductor device;
- a MOSFET device;
- a HEMT device;
- a photovoltaic device; and
- a photodetector device.

17. The method of claim 9, comprising:
performing, in a high vacuum environment below $10^{-3}$ Torr, thermally-cracked elemental sulfur-vapor passivation of an interface surface of an indium gallium arsenide layer disposed on a substrate;
deposition of a dielectric layer on the sulfur-vapor passivated interface surface of the indium gallium arsenide layer disposed on the substrate; and
anneal, after the deposition,
the indium gallium arsenide layer including the sulfur-vapor passivated interface surface thereof, and
the dielectric layer disposed on the sulfur-vapor passivated interface surface.

18. The method of claim 17, wherein the anneal comprises annealing the semiconductor structure at temperature greater than 300° C.

19. The method of claim 18, wherein the anneal comprises annealing the semiconductor structure at temperature greater than 300° C. to obtain an interface defect density ($D_{it}$) distribution at the sulfur-vapor passivated interface surface of the indium gallium arsenide layer of less than less than $2 \times 10^{11}$ eV$^{-1}$ cm$^{-2}$ measured near mid gap across a band-gap.

20. The method of claim 17, wherein the annealing includes annealing the semiconductor structure in hydrogen gas containing ambient at temperature greater than 300° C. to obtain an interface defect density ($D_{it}$) distribution at the sulfur-vapor passivated interface surface of the indium gallium arsenide layer to less than $2 \times 10^{11}$ eV$^{-1}$ cm$^{-2}$ measured near mid gap across a band-gap.

* * * * *